(12) United States Patent
Chang

(10) Patent No.: US 6,842,378 B2
(45) Date of Patent: Jan. 11, 2005

(54) FLASH MEMORY DEVICE AND METHOD OF ERASING THE SAME

(75) Inventor: Seung Ho Chang, Cheongjoo-Shi (KR)

(73) Assignee: Hynix Semiconductor Inc., Ichon-Shi (KR)

(*) Notice: Subject to any disclaimer, the term of this patent is extended or adjusted under 35 U.S.C. 154(b) by 97 days.

(21) Appl. No.: 10/310,142

(22) Filed: Dec. 5, 2002

(65) Prior Publication Data

US 2003/0214852 A1 Nov. 20, 2003

(30) Foreign Application Priority Data

May 17, 2002 (KR) .................................. 10-2002-0027482

(51) Int. Cl.$^7$ ................................................ G11C 16/06
(52) U.S. Cl. .............................. 365/185.22; 365/185.29; 365/185.33
(58) Field of Search ....................... 365/185.22, 185.29, 365/185.33

(56) References Cited

U.S. PATENT DOCUMENTS

| | | | | |
|---|---|---|---|---|
| 5,920,508 A | * | 7/1999 | Miyakawa et al. | 365/185.22 |
| 5,991,206 A | * | 11/1999 | Shin | 365/185.29 |
| 6,137,729 A | * | 10/2000 | Choi | 365/185.29 |
| 6,407,947 B2 | * | 6/2002 | Ahn et al. | 365/185.29 |
| 6,504,765 B1 | * | 1/2003 | Joo | 365/185.29 |
| 6,507,522 B2 | * | 1/2003 | Lee et al. | 365/185.3 |
| 2003/0021150 A1 | * | 1/2003 | Park | 365/185.11 |

* cited by examiner

*Primary Examiner*—Son Mai
(74) *Attorney, Agent, or Firm*—Piper Rudnick LLP

(57) ABSTRACT

The present invention relates to a flash memory device and a method of erasing the same. Pre-program and post-program operations are performed using an automatic verify program method, and an erase operation is performed using an iterative program and verify method, by the use of sense amplifiers that can perform the iterative program and verify method and the automatic verify program method.

11 Claims, 4 Drawing Sheets

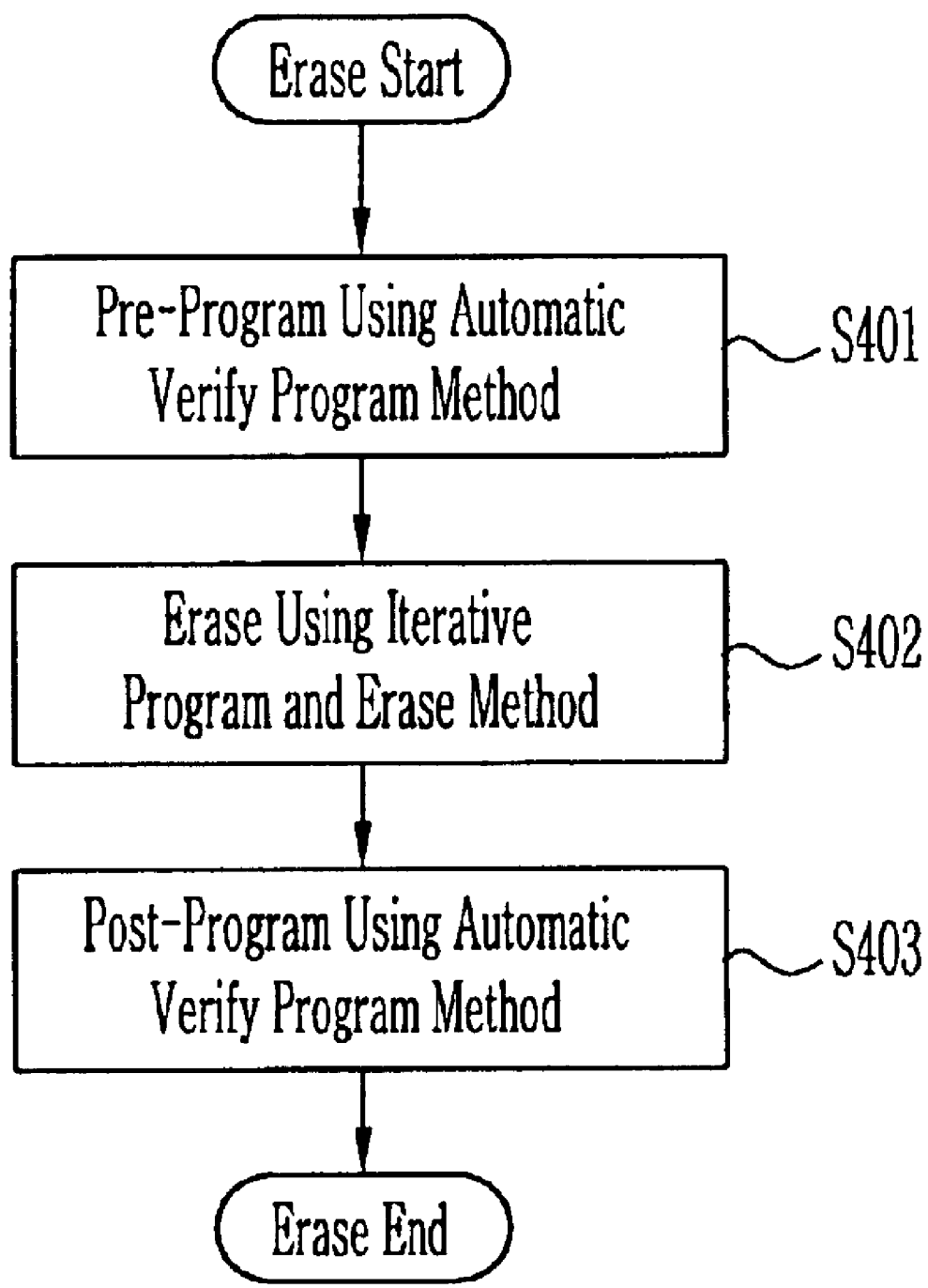

FLASH MEMORY DEVICE AND METHOD OF ERASING THE SAME

BACKGROUND OF THE INVENTION

1. Field of the Invention

The invention relates generally to a flash memory device and a method of erasing the same, and more particularly to, a flash memory device and a method of erasing the same, which can improve the erase speed and characteristic of the flash memory device.

2. Description of the Prior Art

In semiconductor nonvolatile memory devices such as EEPROM (electrically erasable and programmable read only memory) and flash memory devices, NOR type semiconductor nonvolatile memory devices (hereinafter called 'flash memory device') in which a program operation wherein electrons are injected into a floating gate by means of a channel hot carrier electron (hereinafter called 'CHE') injection method is performed and an erase operation using a Fowler-Nordheim (hereinafter called 'F-N') tunneling phenomenon is performed, have been widely used.

Generally, the entire data program procedure in this flash memory device includes program, erase, recovery and read operations as shown in Table 1 below.

TABLE 1

|  | Gate Voltage (VG) | Drain Voltage (VD) | Source Voltage (VS) | Bulk Voltage (VB) |
| --- | --- | --- | --- | --- |
| Program | 9 V | 5 V | 0 V | 0 V |
| Erase | −7.5 V | Floating | Floating | 9 V |
| Recovery | 0 V | 5 V | 0 V | 0 V |
| Read | 4 V | 0.8 V | 0 V | 0 V |

As can be seen from Table 1, the program operation is performed using the CHE injection method. In this operation, the gate voltage (VG) of a voltage that is relatively higher than the drain voltage (VD) and the source voltage (VS) is applied to the control gate, so that electrons are injected into the floating gate.

The erase operation is performed using the F-N tunneling phenomenon. In this operation, the gate voltage (VG) of a low voltage is applied to the control gate, so that the electrons injected into the floating gate are drawn. This erase operation consists of pre-program, erase, and recovery (or post-program) operations (hereinafter called 'post-program'). At this time, the pre-program operation is selectively performed.

The pre-program and post-program operations are performed in order to raise the threshold voltage (Vt) of the memory cell that is relatively low to a desired threshold voltage before and after the erase operation. Generally, in the operations, an iterative program and verify method wherein program and verify operations are sequentially repeatedly performed has been widely used.

In the iterative program and verify method, pre-program, pre-program verify, erase, erase verily, post-program and post-program verify operations are sequentially performed. This will be below described by reference to the flowchart for explaining the method of erasing the flash memory device shown in FIG. 1.

Referring to FIG. 1, the operation of erasing the flash memory device includes the pre-program step (first step), the erase step (second step) and the post-program step (third step), as described above.

In the first step (pre-program step), the pre-program operation is performed (S101), wherein a pre-program bias voltage is set according to an erase start command and the set bias voltage is then supplied to corresponding memory cells to be pre-programmed for an allocated time. After the pre-program operation is completed through the step (S110), a pre-program verify operation is performed (S102), wherein a pre-program verify bias voltage is set and the set bias voltage is then supplied to the corresponding memory cells to be programmed, in order to check whether the pre-program operation was normally performed. If the pre-program verify operation was not normally performed in the step (S102), the process returns to the step (S101) wherein the steps (S101~S103) are iteratively performed, and if the pre-program verify operation was normally performed in the step (S102), the process moves to a step (S104) wherein the erase operation is performed (S103).

In the second step (erase step), the erase operation is performed (S104), wherein an erase bias voltage is set and the set bias voltage is then supplied to corresponding memory cells to be erased for an allocated time. After the erase operation is finished through the step (S104), an erase verify operation is performed (S105), wherein an erase verify bias voltage is set and the set bias voltage is then supplied to the corresponding memory cells to be erased, in order to check whether the erase operation was normally performed. If the erase operation was not normally performed in the step (S105), the process returns to the step (S104) wherein the steps (S104~S106) are iteratively performed, and if the erase operation was normally performed in the step (S105), the process moves to a step (S107) wherein the post-program operation is performed (S106).

In the third step (post-program step), the post-program operation is performed (S107), wherein a post-program bias voltage is set and the set bias voltage is then supplied to corresponding memory cells to be post-programmed for an allocated time. After the post-program operation is finished through the step (S107), a post-program verify operation is performed (S108), wherein a post-program verify bias voltage is set and the set bias voltage is then supplied to the corresponding memory cells to be post-programmed, in order to check whether the post-program operation was normally performed. If the post-program verify operation was not normally performed in the step (S108), the process returns to the step (S107) wherein the steps (S107~S109) are iteratively performed, and if the post-program verify operation was normally performed in the step (S108), the post-program step is finished (S19).

The conventional erase operation mentioned above has the following several problems.

First, as the bias voltages applied upon the program (or erase) and verify operations that are iteratively performed in each of the steps (first step~third step) are different in the erase operation, it is required that operations for setting the bias voltages corresponding to the respective steps (first step~third step) be iteratively performed. Due to this, the operation time for setting the bias voltage is accumulated during the entire erase operation. In particular, time consumed in the pre-program and post-program steps is almost same to time consumed in an actual erase step due to accumulated operating time for setting the bias voltage, thus increasing the erase time.

Second, in the conventional erase operation, time taken to apply the bias voltages in the respective steps (first step~third step) is fixed to the allocated time (e.g. specific time). The bias voltages are continuously applied to the corresponding memory cells during remaining time even though the corresponding memory cells are controlled to the threshold voltages during the allocated time. Due to this, as the threshold voltages of the corresponding memory cells exceed the desired threshold voltages, distribution of the erase memory cells widens. Thus, there are problems such as over erase and reduction in the sensing margin in the memory cell.

Third, in the conventional erase operation, the pre-program and post-program operations of the actual program and erase operations are performed using a normal program algorithm (e.g. a sequential process wherein upon the program and verify operations, the process moves to next 8 bits when the verify operation is passed by iteratively applying the bias voltage), regardless of sector erase or chip erase, or the erase operation of one sector or entire sectors is performed wherein the read operation is intact applied to the pre-program or the post-program, and the pre-program, the post-program and the verify operation are then iteratively performed 8 bits or 16 bits unit being the program and read unit in a code flash memory. Therefore, in case of the chip erase, the erase time same to the sum of time taken to erase the respective sectors is consumed.

Fourth, in the conventional erase operation, the iterative program and verify method wherein the program and verify operations are iteratively performed must be used. Thus, a relatively complicated state machine circuit is needed. Due to this, it is difficult to add various functions including a multi-tasking function to the complicated state machine circuit.

SUMMARY OF THE INVENTION

The present invention is contrived to solve the above problems and an object of the present invention is to provide a flash memory device capable of simplifying a state machine circuit that is complicated as an iterative program and verify methods are used in the conventional erase operation.

Another object of the present invention is to provide a method of erasing the flash memory device capable of reducing time consumed in the pre-program and post-program steps.

Still another object of the present invention is to provide a method of erasing the flash memory device capable of improving lowering in the characteristics such as over-erase and reduction in the sensing margin in the memory cell, which are caused as distribution of the erased memory cell widen since the threshold voltages of corresponding memory cells exceed desired threshold voltages in the erase operation.

In order to accomplish the above object, the flash memory device according to the present invention, is characterized in that it comprises a plurality of sector units including a plurality of memory cells, a sense amplifier control unit for generating a plurality of sense amplifier enable signals, a plurality of sense amplifier units driven by the sense amplifier enable signals and having a plurality of sense amplifiers, wherein the sense amplifiers operate in an automatic verify program mode to automatically perform program and verify operations for corresponding cells, upon pre-program and post-program operations of the memory cells, and operate in an iterative program and verify mode to iteratively perform erase and verify operations for corresponding cells, upon the erase operation, and a plurality of connection switching units for transferring a bias voltage applied from the sense amplifier unit of the plurality of the sense amplifier units to the corresponding memory cells of the sector, depending on a plurality of control signals.

Further, the method of erasing the flash memory device according to the present invention is characterized in that it comprises the steps of automatically performing pre-program and verify operations using an automatic verify program method depending on an erase command of the flash memory cell, iteratively performing erase and verify operations using an iterative program and verify method, and automatically performing post-program and verify operations using the automatic verify program method.

BRIEF DESCRIPTION OF THE DRAWINGS

The aforementioned aspects and other features of the present invention will be explained in the following description, taken in conjunction with the accompanying drawings, wherein:

FIG. 4 is a flowchart for explaining a method of erasing the flash memory device according to a preferred embodiment of the present invention.

DETAILED DESCRIPTION OF PREFERRED EMBODIMENTS

Figure 1:
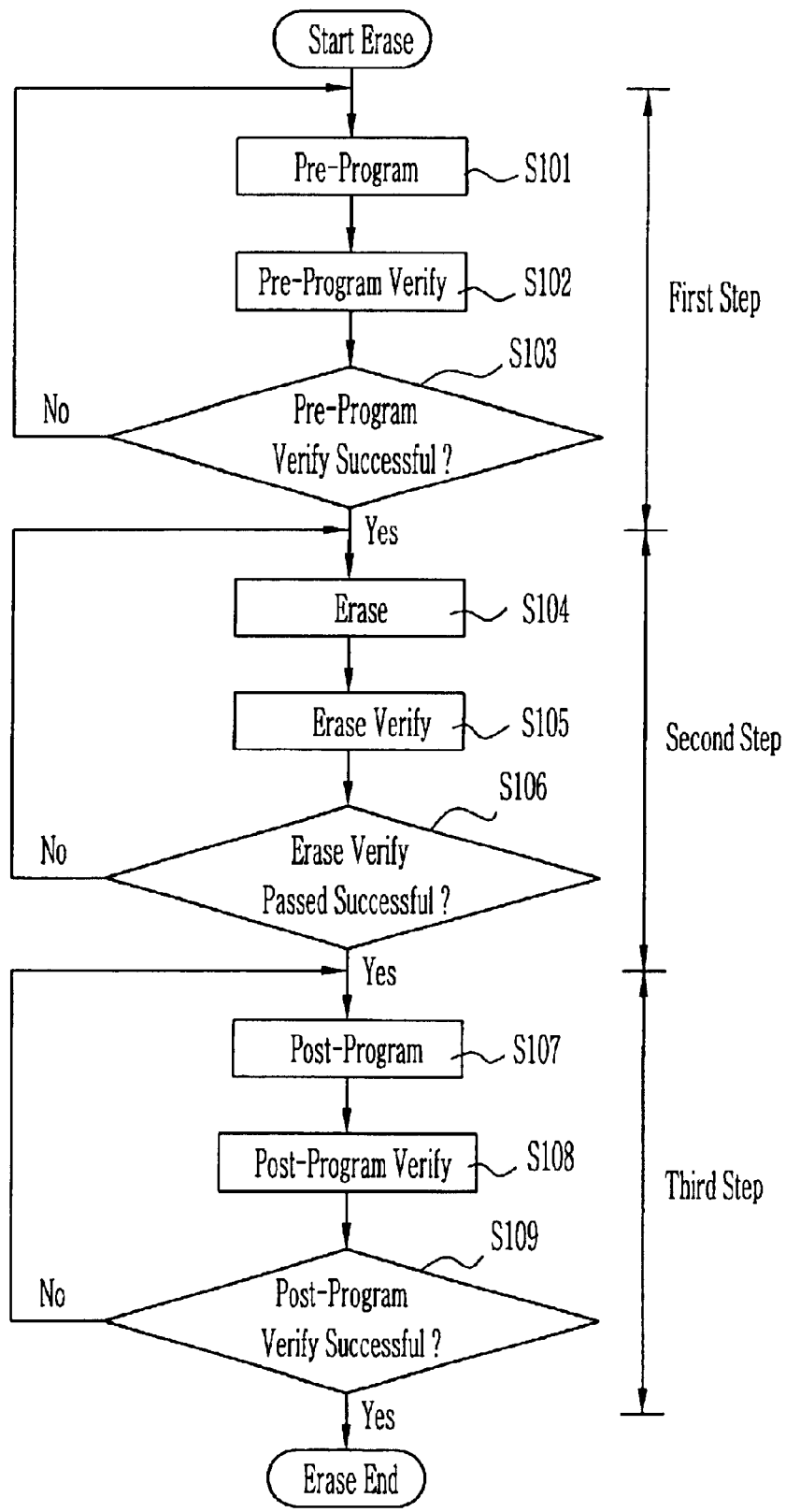
FIG. 1 is a flowchart for explaining a conventional method of erasing a flash memory device.

The present invention will be described in detail by way of a preferred embodiment with reference to accompanying drawings, in which like reference numerals are used to identify the same or similar parts.

Figure 2:
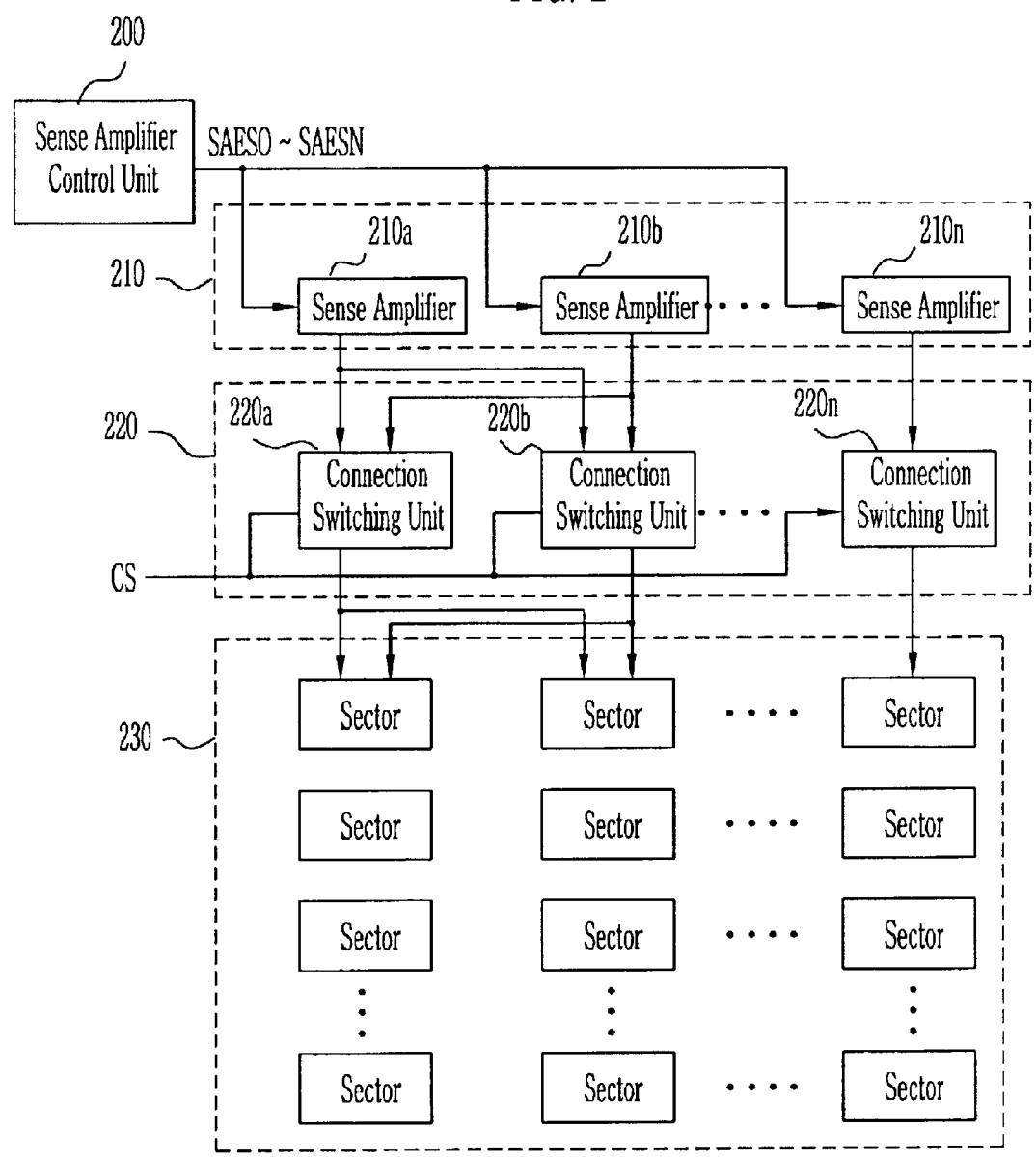
FIG. 2 is a block diagram of a flash memory device according to a preferred embodiment of the present invention.

FIG. 2 is a block diagram of a flash memory device according to a preferred embodiment of the present invention.

Referring now to FIG. 2, the flash memory device comprises a sense amplifier control unit 200, a sense amplifier unit group 210 having a plurality of sense amplifier units 210a~210n, a connection switching unit group 220 having a plurality of connection switching units 220a 220n, and a sector group 230 having sectors consisting of a plurality of memory cells.

The sense amplifier control unit 200 controls the operations of a plurality of sense amplifiers (see FIG. 3) each included in the sense amplifier units 210a~210n and generates a plurality of sense amplifier enable signals (SAES0~SAESN) corresponding to the number of the sense amplifiers included in a single sense amplifier unit, to the sense amplifiers, respectively.

The sense amplifier unit group 210 includes the plurality of the sense amplifier units 210a~210n having the plurality of sense amplifiers that are driven by the plurality of the sense amplifier enable signals (SAES0~SNESN) inputted from the sense amplifier control unit 200. The sense amplifier units 210a~210n are connected to two neighboring connection switching units, for example the connection switching units 220a and 220b and transmit a program (or erase) bias voltage to the memory cells in a single sector through the connection switching units 220a and 220b depending on the plurality of the sense amplifier enable signals (SAES0~SAESN). A detailed explanation on the structure and operation of the sense amplifiers will be given by reference to FIG. 3 in which only one sense amplifier is shown for convenience of explanation.

The connection switching unit group 220 includes the plurality of the connection switching units 220a~220n including switching devices such as a plurality of MOS transistors. The connection switching units 220a~220n are driven by a plurality of control signals (CS) outputted from a control signal unit (not shown) and transmit the program (or erase) bias voltages outputted from the sense amplifier units 210a~210n to the memory cell of a corresponding sector among the sectors included in the sector group 230. For example, the control signal unit includes a decoding circuit for outputting the control signals (CS) controlling the plurality of the connection switching units 220a~22n, in order to transfer the program (or erase) bias voltages of the memory cell applied from the sense amplifiers to the corresponding memory cell through the plurality of the connection switching units 220a~220n. Each of the MOS transistors included in the switching units 220a~220n as a switching device is driven by the control signal (CS). The MOS transistors (not denoted in the figures) are connected between the node (NP) of a respective the sense amplifier and a respective one memory cell FMC of the plurality of the memory cells shown in FIG. 3.

Figure 3:
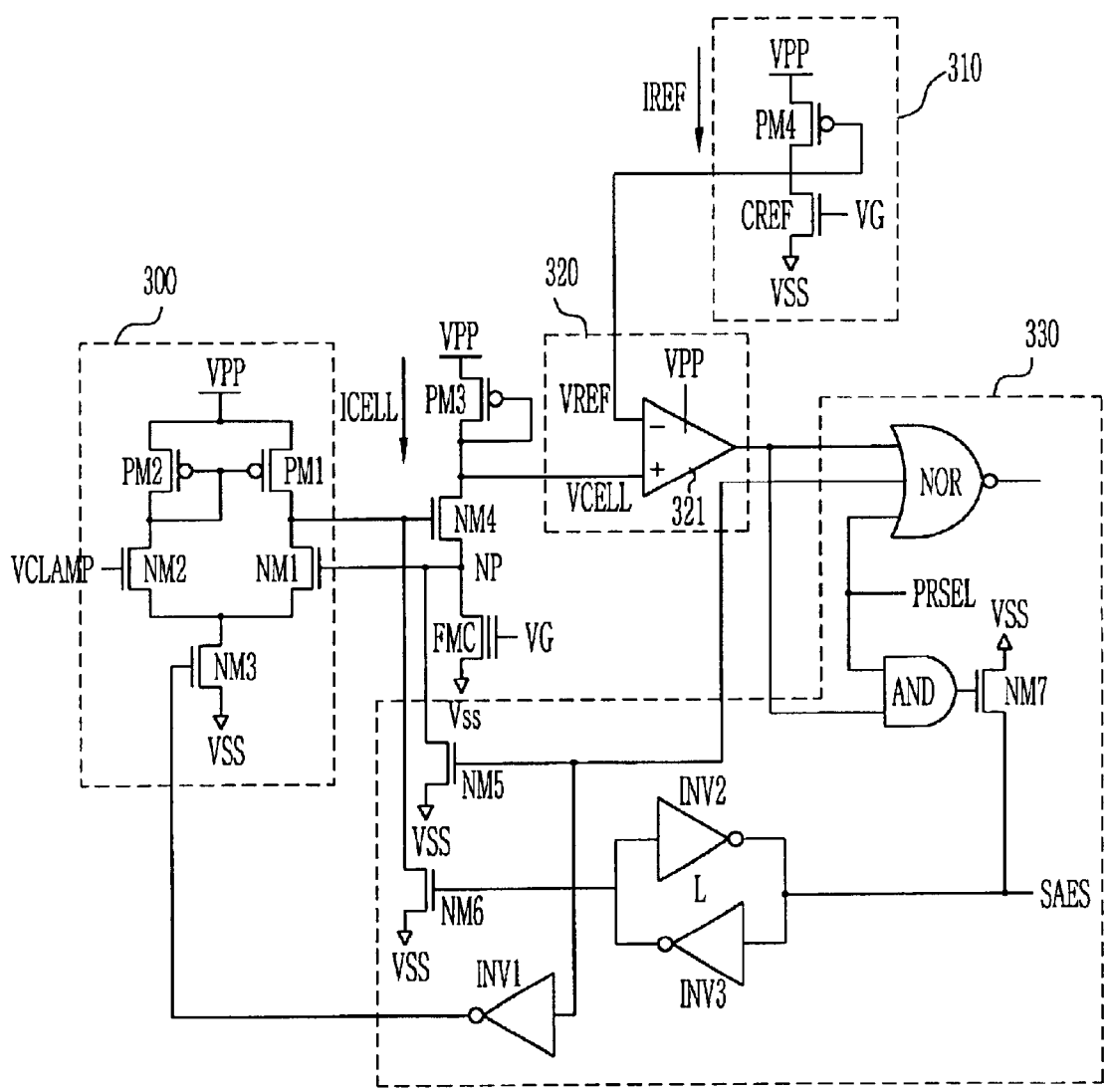
FIG. 3 is a detailed circuit diagram of the sense amplifier shown in FIG. 2.

As shown in FIG. 3, the sense amplifier is constructed to perform the iterative program and verify methods that are usually used in the erase method of the flash memory device, and an auto verify program method (or simultaneously program and verify method) wherein all the program conditions are removed as soon as the program operation is finished while continuously applying a long program bias voltage until the program operation is completed upon the program operation.

Referring to FIG. 3, the sense amplifier that can perform the two erase methods comprises a voltage adjusting unit 300, a reference voltage adjusting unit 310, a comparator 320 and a sense amplifier driving setting unit 330. The sense amplifier further comprises a PMOS transistor PM3 driven as a diode, and a NMOS transistor NM4 driven by the output signal of the voltage adjusting unit 300, both of which are serially connected between the power supply terminal VPP and a selected cell FMC (hereinafter called 'selected cell') of corresponding memory cells.

The voltage adjusting unit 300 controls the voltage applied to the drain terminal of the selected cell FMC of the corresponding memory cells. The voltage-adjusting unit 300 includes PMOS transistors PM1 and PM2 operating as the current mirror, NMOS transistors NM1 and NM2 operating as the differential amplifier, and a NMOS transistor NM3 for maintaining the potential of the source terminals of the NMOS transistors NM1 and NM2 to the ground voltage.

The PMOS transistors PM1 and PM2 have source terminals commonly connected to the power supply terminal VPP, and drain terminals connected to the drain terminals of the NMOS transistors NM1 and NM2, respectively. The PMOS transistors PM1 and PM2 are driven by the drain voltage of the NMOS transistor NM2. Thus, the PMOS transistors PM1 and PM2 maintain the drain current of the NMOS transistor NM1 and thus serves as static current sources of the NMOS transistors NM1~NM2 operating as the differential amplifier.

The NMOS transistors NM1 and NM2 include the source terminals commonly connected to the drain terminal of the NMOS transistor NM3, and the drain terminals each connected to the drain terminals of the PMOS transistors PM1 and PM2. Also, the NMOS transistor NM2 is driven by a clamp signal (VCLAMP) for clamping the drain voltage of the selected cell FMC and the NMOS transistor NM1 is driven by the drain voltage of the selected cell. Accordingly, the NMOS transistors NM1 and NM2 amplify the difference between the clamp signal (VCLAMP) and the drain voltage of the selected cell FMC to produce it to the gate terminal of the NMOS transistor NM4.

The reference voltage-adjusting unit 310 generates a reference voltage (VREF) inputted to the comparator 320. The reference voltage adjusting unit 310 includes a PMOS transistor PM4 operating as a diode, which has a source terminal connected to the power supply terminal VPP and a gate terminal and a drain terminal connected to each other, and a reference cell (CREF) connected between the drain terminal of the PMOS transistor PM4 and the ground terminal VSS, which is driven by the gate voltage (VG) to output the reference voltage (VREF) to the comparator 320.

The comparator 320 includes a differential amplifier 321 for comparing the reference voltage (VREF) inputted to one of input terminals and the cell voltage (VCELL) of the selected cell FMC inputted to the other terminal of the input terminal. The differential amplifier 321 is driven by the power supply voltage applied form the power supply terminal VPP.

The sense amplifier driving setting unit 330 controls the operation of the voltage adjusting unit 300 depending on the sense amplifier enable signal (SAES) outputted from the sense amplifier control unit 200 (see FIG. 2). The sense amplifier driving setting unit 330 includes a latch unit L, an inverter INV1, NMOS transistors NM5~NM7, an AND gate AND and a NOR gate NOR.

The latch unit L latches the sense amplifier enable signal (SAES) and includes inverters INV2 and INV3 that are connected in parallel in opposite directions. The inverter INV1 inverts the output signal of the latch unit L to transfer the inverted signal to the NMOS transistor NM3 of the voltage-adjusting unit 300. A NMOS transistor NM5 is connected between the drain terminal of the selected cell FMC and the ground terminal VSS and is driven by the output signal of the latch unit L. The NMOS transistor NM5 maintain the potential of the drain terminal of the selected cell FMC at the ground voltage. A NMOS transistor NM6 is connected between the drain terminal of the NMOS transistor NM1 and the ground terminal VSS and is driven by the output signal of the latch unit L. The NMOS transistor NM6 keeps the potential of the drain terminal of the NMOS transistor NM1 at the ground voltage. A NMOS transistor NM7 is connected between the input terminal of the latch unit L and the ground terminal VSS and is driven by the output signal of the AND gate AND. The MOS transistor NM7 keeps the input terminal of the latch unit L at the ground voltage. The AND gate AND performs a logical product of the output signal of the comparator 320 and the program/read mode selection signal (PRSEL). The NOR gate NOR performs a negation logical product of the output signal of the comparator 320, the output signal of the latch unit L and the program/read mode selection signal (PRSEL).

The operation characteristic of the sense amplifier having the construction shown in FIG. 3 will be described by dividing it into the iterative program and verify method and the automatic verify program method.

<Iterative Program and Verify Method>

In common program operations (for example, the pre-program and the post-program), the program operation is performed wherein the program bias voltage is applied from a bias voltage supply unit (not shown) to the drain and gate terminals of the selected cell FMC for an allocated time, regardless of the sense amplifier.

Meanwhile, upon the program (or erase) verify operation, if a read mode is selected and the program/read mode selection signal (PRSEL) is inputted to the AND gate AND of the sense amplifier with a logical HIGH (hereinafter called '0'), the AND gate AND always outputs the output signal of '0' regardless of the output signal of the comparator 320. Thus, a current path between the ground terminal VSS and the latch unit L through the NMOS transistor NM7 is precluded and the operation of the sense amplifier is thus decided by the sense amplifier enable signal (SAES).

In the above, if the sense amplifier enable signal (SAES) is inputted with a HIGH state (hereinafter called '1'), the sense amplifier enable signal (SAES) is inputted to the gate terminal of the NMOS transistor NM3 as '1' through the latch unit L and the inverter INV1 to drive the NMOS transistor NM3. The voltage-adjusting unit 300 is thus driven by the NMOS transistor NM3. Accordingly, the NMOS transistor NM4 is driven so that the cell current (ICELL) is inputted from the power supply terminal VPP to the selected cell FMC through the PMOS transistor PM3.

Next, the comparator 320 compares the reference voltage (VCELL) corresponding to the cell current (ICELL) inputted to the selected cell FMC, and the reference voltage (VREF) corresponding to the reference current (IREF) inputted from the reference voltage adjusting unit 310 to check whether the selected cell FMC is normally programmed. Then, the comparator 320 outputs the resulting value to the NOR gate NOR. If it is determined that the program operation for the selected cell FMC was not normally performed based on the resulting value outputted through the NOR gate NOR, the program and verify operations are iteratively performed until the program operation is normally performed.

<Automatic Verify Program Method>

As describe above, the automatic verify program method is one wherein all the program conditions are removed as soon as the program operation is completed while continuously applying the long program bias voltage until the program operation is completely finished upon the program operations (for example, the pre-program and the post-program). If the program operation is completed, the program verify operation is automatically performed.

In concrete, the program operation is performed wherein the program bias voltage is applied to the drain terminal of the selected cell FMC through the voltage adjusting unit 300 of the sense amplifier for an allocated time. As such, the cell current (ICELL) flowing into the selected cell FMC is reduced during the time when the program operation operates. The cell voltage (VCELL) is proportionally increased due to the reduced cell current (ICELL). At this time, the comparator 320 senses the reference current (IREF) (i.e., the reference voltage (VREF)) inputted as a predetermined value from the reference voltage adjusting unit 310 while sensing variation in the cell voltage (VCELL) depending on variation in the cell current (ICELL). As soon as the cell current (VCELL) is lower than the reference voltage (VREF), the comparator 320 outputs the output signal of '1' to the AND gate AND.

Meanwhile, in the program operation, if the program mode is selected and the output signal of '1' is inputted from the comparator 320 in a state that the program/read mode selection signal (PRSEL) of '1' is inputted to the AND gate AND of the sense amplifier, the AND gate AND outputs the output signal of '1' to the NMOS transistor NM7. At this time, the NMOS transistor NM7 is driven by the output signal of '1' of the AND gate AND to shift the sense amplifier enable signal (SAES) to a '0' state.

The sense amplifier enable signal (SAES) of the '0' state is inverted through the inverter INV3 of the latch unit L and is then applied to the gate terminal of the NMOS transistor NM5. Also, the inverted sense amplifier enable signal (SAES) is re-inverted the latch unit L and the inverter INV1 and is then applied to the gate terminal of the NMOS transistor NM3 in the voltage adjusting unit 300. Accordingly, the NMOS transistor NM5 is driven by the inverted sense amplifier enable signal (SAES) to keep the potential of the drain terminal of the selected cell FMC at the ground voltage. Also, the NMOS transistor NM3 is not driven by the sense amplifier enable signal (SAES). As such, as the NMOS transistor NM3 is not driven and the voltage-adjusting unit 300 is thus not driven, the bias voltage applied to the drain terminal of the selected cell FMC is precluded so that the program operation is automatically stopped. In other words, in the program operation, the operation of the sense amplifier is controlled to automatically stop the program operation being performed, so that the verify operation is automatically performed.

As described above, the method of erasing the flash memory device using the sense amplifier having the iterative program and verify method and the automatic verify program method according to the preferred embodiment of the present invention will be described by reference to the flowchart shown in FIG. 4.

Referring now to FIG. 4, the method of erasing the flash memory device can be performed in the sector unit or the chip unit through the sense amplifier control unit 200 constituting the flash memory device shown in FIG. 2. This is because the operations of the sense amplifier units 210a~210n can be controlled using the plurality of the sense amplifier enable signals (SAES0~SAESN) outputted to the sense amplifier control unit 200.

In concrete, in the method of erasing the flash memory device, the pre-program operation is performed (S401) using the automatic verify program method. In the step (S401), in order to minimize distribution of the threshold voltage of corresponding memory cells after the erase operation, the pre-program bias voltage for raising the threshold voltages of the corresponding memory cells that are already erased by the threshold voltages of the programmed memory cells are applied to the corresponding memory cells before the erase bias voltage is applied. Next, if it is determined that the threshold voltages of the corresponding memory cells are raised to target threshold voltages, the pre-program bias voltage is automatically precluded and the pre-program and pre-program verify operations are thus finished. At this time, the pre-program verify operation is performed until the operation for one sector or the entire sectors (in case that the erase operation is performed in the chip unit) through the sense amplifiers selected by the sense amplifier control unit 200 (see FIG. 2) is finished.

After the step (S401) is finished, the erase operation is performed through the iterative program and verify method (S402). In the step (S402), the erase bias voltage is applied to the corresponding memory cells. The erase and erase verify operation is then iteratively performed until the verify operation for the selected sector or the entire sectors (in case that the erase operation is performed in the chip unit) is completed.

After the step (S402) is finished, the post-program operation is performed using the automatic verify program method (S403). In the step (S403), the post-program bias voltage for raising the threshold voltages of the corresponding memory cells that are over erased in the step (S402) to the target threshold voltages is applied to the corresponding memory cells. Next, if it is determined that the threshold voltages of the corresponding memory cells are raised to the target threshold voltages, the post-program bias voltage is automatically precluded and the post-program and post-program verify operations are thus finished. At this time, the post-program verify operation is performed until the operation for one sector or the entire sectors is finished through the sense amplifiers selected by the sense amplifier control unit 200.

Further, according to the method of erasing the flash memory device, during the pre-program and post-program steps, the erase operations for the memory cells for which the erase operations are not performed among the corresponding sector are simultaneously performed by increasing the number of the operations of the sense amplifiers included in at least one of the sense amplifier unit of the sense amplifier units 210a~210n. Thus, the entire-time taken by the erase operation is reduced. In concrete, in case of the normal program operation, the program and verify operations are performed in 8 bits or 16 bits. In case of the pre-program and post-program operations, however, the degree to be programmed is relatively smaller than the normal program operation. Thus, the bias voltage can be sufficiently applied through the voltage supply unit (or the voltage adjusting unit), and the pre-program operation and the post-program operation can be thus performed in over 16 bits at a time.

As mentioned above, according to the present invention, the erase operation is performed using the sense amplifier that can perform the iterative program and verify method and the automatic verify program method. Therefore, the present invention has an advantageous effect that it can implement the flash memory device having a state machine circuit that can be easily implemented.

Further, in the present invention, the pre-program and post-program steps are performed using the automatic verify program method and the erase operation is performed using the iterative program and verify method. Thus, the present invention has an advantageous effect that it can shorten time consumed in the pre-program and post-program steps.

Also, according to the present invention, the present invention can improve lowering in the characteristics such as over-erase and reduction in the sensing margin that occur due to widen distribution of the erase memory cell as the threshold voltage of a corresponding memory cell exceeds a desired threshold voltage in the erase operation.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device, comprising:
   a plurality of sector units including a plurality of memory cells;
   a sense amplifier control unit for generating a plurality of sense amplifier enable signals;
   a plurality of sense amplifier units driven by the sense amplifier enable signals and having a plurality of sense amplifiers, wherein the sense amplifiers operate in an automatic verify program mode to automatically perform program and verify operations for corresponding cells, upon pre-program and post-program operations of the memory cells, and operate in an iterative program and verify mode to iteratively perform erase and verify operations for corresponding cells, upon the erase operation; and
   a plurality of connection switching units for transferring a bias voltage applied from a sense amplifier unit of the plurality of the sense amplifier units to the corresponding memory cells of the sector, depending on a plurality of control signals.

2. The flash memory device as claimed in claim 1, wherein each of the plurality of sense amplifiers comprises:
   a voltage-adjusting unit for controlling a drain voltage applied to a drain terminal of a selected cell of the memory cells through the connection switching unit;
   a reference voltage adjusting unit for generating a reference voltage;
   a comparator for comparing the drain voltage of the selected cell and the reference voltage; and
   a sense amplifier operating setting unit for controlling the operation of the voltage adjusting unit depending on the a sense amplifier enable signal of said plurality of sense amplifier enable signals.

3. The flash memory device as claimed in claim 2, wherein the voltage adjusting unit comprises:
   first and second PMOS transistors operating as current mirror, wherein the first and second PMOS transistors have source terminals connected each other and commonly connected to the power supply terminal, and gate terminals connected each other;
   first and second NMOS transistors operating as a differential amplifier and driven by a clamp signal and the drain voltage of the selected cell, wherein the first and second NMOS transistors have drain terminals connected to the drain terminals of the first and second PMOS transistors, respectively, and source terminals connected each other; and
   a third NMOS transistor connected between the source terminals of the first and second NMOS transistors and the ground terminal and driven by the output signal of the sense amplifier operating setting unit.

4. The flash memory device as claimed in claim 2, wherein the sense amplifier operating setting unit comprises:
   a latch unit for latching the sense amplifier enable signals;
   an inverter for inverting the output signal of the latch unit to output the inverted signal to the voltage adjusting unit;
   a first NMOS transistor for maintaining the output signal of the voltage adjusting unit driven by the output signal of the inverter at the ground voltage, depending on the output signal of the latch unit;
   a second NMOS transistor for maintaining the drain voltage of the selected cell at the ground voltage depending on the output signal of the latch unit;
   a NOR gate for performing a negation logical product of the program/read mode selection signal, the output signal of the latch unit and the output signal of the comparator; an AND gate for performing a logical product of the output signal of the comparator and the program/read mode selection signal; and
   a third NMOS transistor for maintaining the sense amplifier enable signal at the ground voltage depending on the output signal of the AND gate.

5. The flash memory device as claimed in claim 1, wherein the connection switching units include a plurality of NMOS transistors or PMOS transistors for electrically connecting the plurality of sense amplifiers and the memory cells, respectively, depending on the control signals.

6. A method of erasing a flash memory device, comprising the steps of:
   (a) automatically performing pre-program and verify operations using an automatic verify program method depending on an erase command of the flash memory cell;
   (b) iteratively performing erase and verify operations using an iterative program and verify method; and
   (c) automatically performing post-program and verify operations using the automatic verify program method.

7. The method as claimed in claim 6, wherein in the step (a), in order to minimize distribution of corresponding memory cells after the step (c), a pre-program bias voltage for raising the threshold voltages of the corresponding memory cells to the threshold voltages of the programmed memory cells are applied to the corresponding memory cells, the threshold voltages of the corresponding memory cells are sensed, and as the result of the sensing, if the threshold voltages of the corresponding memory cells are raised to target threshold voltages, the pre-program bias voltage is automatically precluded to finish the pre-program and pre-program verify operations.

8. The method as claimed in claim 7, wherein the pre-program verify operation is performed in a selected sector unit or a chip unit.

9. The method as claimed in claim 6, wherein in the step (6), the erase operation is performed by applying the erase bias voltage to corresponding memory cell, and the erase and erase verify operations are iteratively performed until all the erase verify operations are completed in the selected sector unit or the chip unit by applying an erase verify bias voltage.

10. The method as claimed in claim 6, wherein in the step (c), the post-program bias voltage for raising the threshold voltages of corresponding memory cells that are over erase in the step (b) to target threshold voltages are applied to the corresponding memory cells, sensing the threshold voltages of the corresponding memory cells, and as the result of the sensing, if the threshold voltages of the corresponding memory cells are raised to the target threshold voltages, the post-program bias voltage is automatically precluded to complete the post-program and post-program verify operations.

11. The method as claimed in claim 10, wherein the post-program verify operation is performed a selected sector unit or chip unit.

* * * * *